(12) United States Patent
Naroska et al.

(10) Patent No.: US 6,751,565 B2
(45) Date of Patent: Jun. 15, 2004

(54) FAST WAVEFORM DISPLAY METHOD AND SYSTEM

(75) Inventors: Edwin Kurt Naroska, Dortmund (DE); Fei-Pei Lai, Taipei (TW); Chung-Chia Chen, Hsin-Chu (TW)

(73) Assignee: Springsoft, Inc., Hsin-Chu Hsien (TW)

( * ) Notice: Subject to any disclaimer, the term of this patent is extended or adjusted under 35 U.S.C. 154(b) by 195 days.

(21) Appl. No.: 10/064,213

(22) Filed: Jun. 21, 2002

(65) Prior Publication Data

US 2003/0236640 A1 Dec. 25, 2003

(51) Int. Cl.$^7$ .............................................. G01R 13/02
(52) U.S. Cl. ............................ 702/67; 702/66; 702/70; 702/71; 345/441; 345/667; 345/668; 345/669; 345/670; 345/671
(58) Field of Search ............................ 702/67, 66, 70, 702/71; 345/441, 667–671

(56) References Cited

U.S. PATENT DOCUMENTS

| | | | | |
|---|---|---|---|---|
| 5,079,720 A | * | 1/1992 | Sinclair | ...................... 345/443 |
| 5,517,105 A | * | 5/1996 | Holzwarth | ............... 324/121 R |
| 5,519,820 A | * | 5/1996 | Kawauchi et al. | ........... 345/440 |
| 5,684,508 A | * | 11/1997 | Brilman | .................... 345/440.1 |
| 5,877,620 A | * | 3/1999 | Tomi | ........................ 324/76.12 |

\* cited by examiner

*Primary Examiner*—Kamini Shah
*Assistant Examiner*—Anthony T. Dougherty
(74) *Attorney, Agent, or Firm*—Winston Hsu

(57) ABSTRACT

Waveform data contains waveform signals having transition events and is subdivided into data blocks. Indexing elements are provided for each waveform signal that correspond to a time range of the waveform data, and have a pointer to a data block within which transition events for the waveform signal are stored. Each indexing element has a maximum interval value that indicates the maximum amount of time spanned between transition events of the waveform signal. A minimum time resolution that may be adequately resolved on the display is computed. For indexing elements having maximum interval values that exceed the minimum time resolution, the pointers of the indexing elements are used to access and draw transition events for the waveform signals. For indexing elements having maximum interval values that are less than the minimum time resolution, a predetermined image in place of transition events for the waveform signals is drawn.

12 Claims, 12 Drawing Sheets

FAST WAVEFORM DISPLAY METHOD AND SYSTEM

BACKGROUND OF INVENTION

1. Field of the Invention

The present invention relates to a display method and system. More specifically, a method is disclosed providing for the rapid display of waveform data in a circuit simulation system.

2. Description of the Prior Art

More and more, designers of complex electronics are turning to circuit simulation systems to design, test and debug the circuits they are creating. Using simulators over the physical circuits themselves provides for greater rapidity and flexibility in design changes, and for significant savings in both cost and time during the design cycle.

To "layout" their circuits, hardware designers turn to a specialized software, termed hardware development language (HDL), such as Verilog or VHDL, to code the circuit design into a machine-readable format that can be executed by a simulator to generate simulation data. This HDL code may also be parsed to graphically present on a display system the actual circuit layout.

When debugging, circuit designers look through the circuit simulation data generated by the simulator, and compare simulated line signals against desired results. Signals that are not behaving as desired indicate bugs in the HDL code, and hence in the circuit design. Such simulation data is generally presented by a computer on a display. Please refer to FIG. 1. FIG. 1 illustrates simulated waveform results 18a being presented on a monitor 18 by an HDL design system 10. The HDL design system 10 is a computer system, typically a personal computer (PC), though minicomputers and mainframes are also frequently used. The exact computational platform is relatively unimportant, the difference being one merely of computational power, and hence speed. The computer system 10 will typically include an editor 12 that enables a user to modify HDL source code 12a, and a simulator 14 which uses the HDL source code 12a to generate simulation data 14a, essentially "running" the circuit coded by the HDL source code 12a for a specific "time" and storing the results as simulation data 14a. The simulation data 14a typically holds the state of all circuit elements throughout the simulated run time. A display system 16 is then used to present the simulation data 14a to the user on a monitor 18, as well as using the HDL source code 12a to present a graphical illustration of the circuit. As shown on the monitor 18, the circuit simulation data 14a is typically presented in the form of waveforms 18a, each waveform 18a showing the evolution of a state of a circuit element over time. The state of a circuit element is a signal, circuit elements influencing each other by exchanging signals by way of conductive lines, and accepting signals from an outside source. Hence, the simulation data 14a is simply a vast array of signals and how these signals change with time. User I/O devices 10a permit the user to control the HDL design system 10.

When debugging a circuit, it is frequently necessary to look at various sections, in terms of time, of the simulation data 14a. The display system 16 thus permits the user to scroll, zoom in and zoom out the waveforms 18a. Consider, for example, FIGS. 2a through 2c, with reference to FIG. 1. FIGS. 2a through 2c illustrate zooming out on a waveform for a signal sf. Signal sf may, for example, represent the output state of an AND gate, or be one of several input lines into a multiplexer. In any event, within FIG. 2A, the display system 16 presents a waveform 20a for the signal sf over a certain span of simulated time, the range of time indicated by a timeline 21a. Simulated time increases from left to right on the display 18, while changes to the signal sf are indicated by corresponding vertical changes in the waveform 20a. A user instructs the display system 16 to zoom out on the waveform 20a, and the result of this action is presented in FIG. 2B as a waveform 20b, and a corresponding timeline 21b. In FIG. 2B, dotted lines indicate the portion of the waveform 20a visible in FIG. 2A. After zooming out, a greater extent (in terms of simulated time) of the signal sf is present on the display 18 in the form of waveform 20b. However, a greater amount of time must be squeezed into the same horizontal width of the display 18, and waveform 20b is thus correspondingly diminished along the horizontal axis of the display 18. Generally, when displaying a signal, zooming in or zooming out of the corresponding waveform will leave the scaling of the vertical axis unchanged. Another zoom out procedure is performed on waveform 20b, resulting in a new waveform 20c presented on the display 18, as shown in FIG. 2C, and a new timeline 21c. Dotted lines in FIG. 2C illustrate the extent of the signal sf present as waveform 20b in FIG. 2B. Again, a greater amount of time is presented along the same horizontal width of the display 18, so that transitions in the waveform 20c are closer together than the same transitions in waveforms 20a and 20b.

The display 18 has a fixed resolution and eventually, as the user continues to zoom out, transitions in the waveform will begin to exceed the resolution of the display 18. Please refer to FIG. 3 for an example of this. FIG. 3 is a detailed view of the display 18 when attempting to display a highly compressed waveform 23. As is well known in the art of display technologies, the display 18 is typically composed of a plurality of pixels 18p, all of which have a uniform width and height. It is convenient to think of the pixels 18p as squares, though this is not necessarily the case. Nevertheless, the pixels 18p all have a width 18w, and thus, in terms of the waveform 23, span a region of simulated time. To draw the waveform 23, the display system 16 determines which pixels 18p lie in the path of the waveform 23, and then colors these pixels 18p accordingly. For example, all pixels 18p may be initially colored black. When the waveform 23 is computed and drawn, all pixels 18p in the path of the waveform 23 are colored white. A white waveform 23 should thus appear on the display 18 against a black background. However, the transition frequency of the waveform 23 exceeds the width 18w of the pixels 18p. Hence, all pixels 18p within a block 18b will be colored white. In effect, the user is not presented the waveform 23, but rather a solidly filled rectangle of white. Worse still, though, is that generating this solid rectangle 18b is relatively slow. The waveform 23 is clearly made up of a plurality of horizontal line segments 23h and vertical line segments 23v, each having a start-point and an end-point. To draw the waveform 23, the display system 16 repetitively feeds the start and end point pairs to a line drawing algorithm 16L. Such line drawing algorithms 16L are well known in the art of computer display technology, and simply draw a line on the display 18 that connects the start point pixel 18p to the end point pixel 18p, coloring all such intermediate pixels 18p to a desired color, such as white. The line drawing algorithm 16L may be implemented in either hardware or software. When drawing the waveform 23, unnecessary calls are made to the line drawing algorithm 16L to draw pixels 18p that have already been colored by a previous transition of the waveform 23. For example, in a column 23c of pixels 18p within the block 18b, as many as seven calls to the line drawing algorithm 16L are made to color the same column 23c of pixels 18p, due to the seven vertical lines 23v of the waveform 23 that lie within the column 23c. This significantly slows the display speeds of the HDL design system 10 when presenting the waveform 23.

SUMMARY OF INVENTION

It is therefore a primary objective of this invention to provide a method and associated system that permits the rapid displaying of waveform data.

Briefly summarized, the preferred embodiment of the present invention discloses displaying waveform data on a display of a computer system. The waveform data contains waveform signals, each waveform signal having at least one transition event. The waveform data is subdivided into data blocks. For each waveform signal, at least one indexing element is provided, each indexing element corresponding to a time range of the waveform data. Each indexing element has a pointer into at least one of the data blocks within which transition events for the waveform signal, in the time range corresponding to the indexing element, are stored. Each indexing element also has a maximum interval value. The maximum interval value indicates the maximum amount of time spanned between transition events of the waveform signal within the time range corresponding to the indexing element. A minimum time resolution within which transition events of the waveform signal may be adequately resolved on the display is computed. For an indexing element having a maximum interval value that exceeds the minimum time resolution, the pointer of the indexing element is used to access and draw transition events for the waveform signal that are within the time range of the indexing element. For an indexing element having a maximum interval value that is less than the minimum time resolution, a predetermined image in place of transition events for the waveform signal is drawn.

It is an advantage of the present invention that by providing the indexing elements with their respective maximum interval values, it is possible to quickly eliminate blocks of waveform data that are effectively not displayable because they exceed the resolution capabilities of the display. Consequently, rather than wasting computational resources and time displaying this data, a predetermined image may be drawn instead. Additionally, flags may be added to the indexing elements, indicating the presence of special signal conditions that may require additional recognition.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
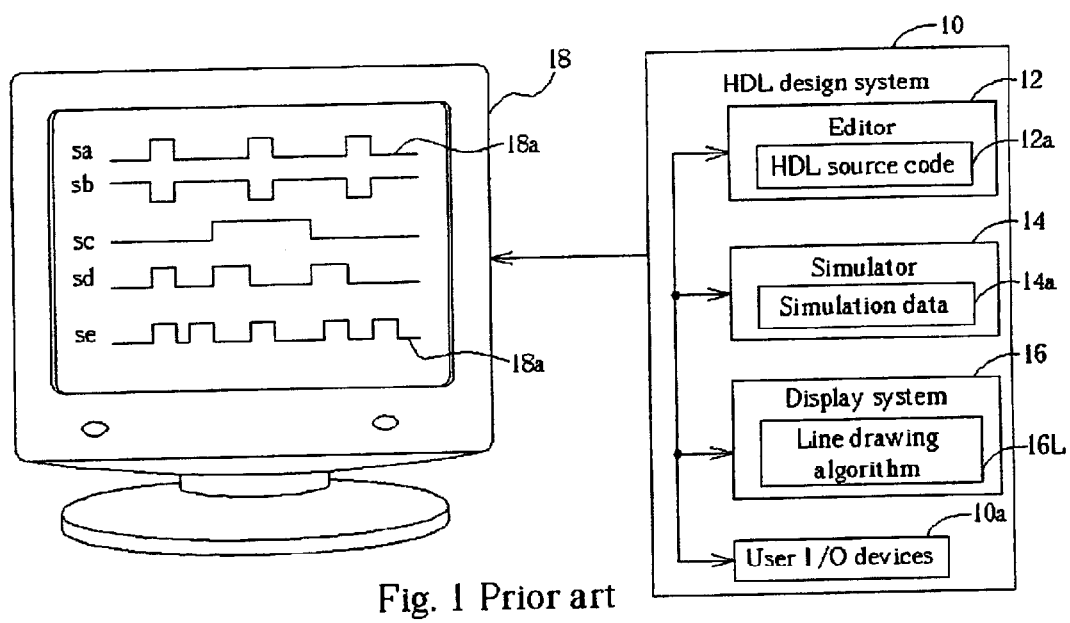
FIG. 1 illustrates simulated waveform results being presented on a monitor by a hardware development language (HDL) design system according to the prior art.
Figure 2A:
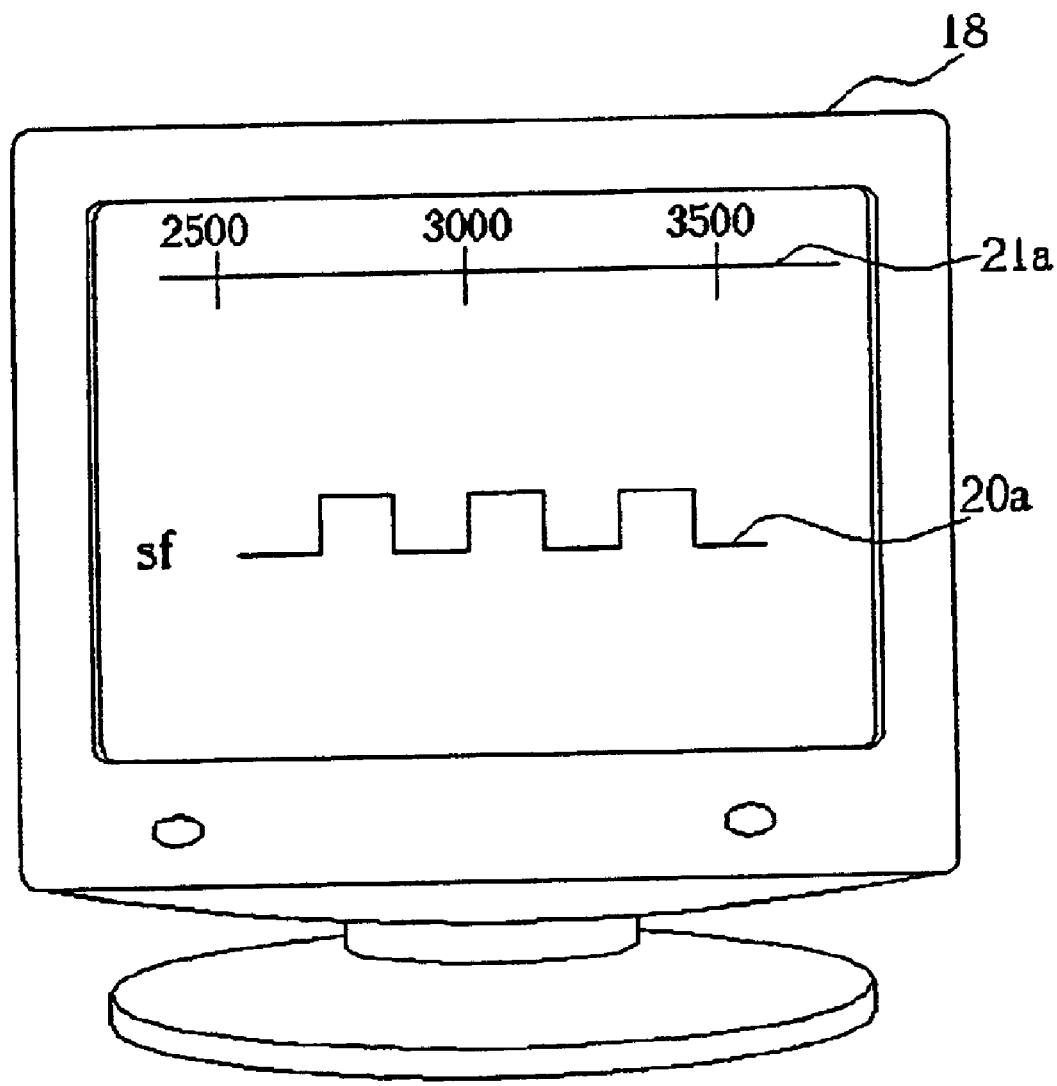
FIG. 2A to FIG. 2C illustrate a zoom out sequence when displaying waveform data according to the prior art.
Figure 2B:
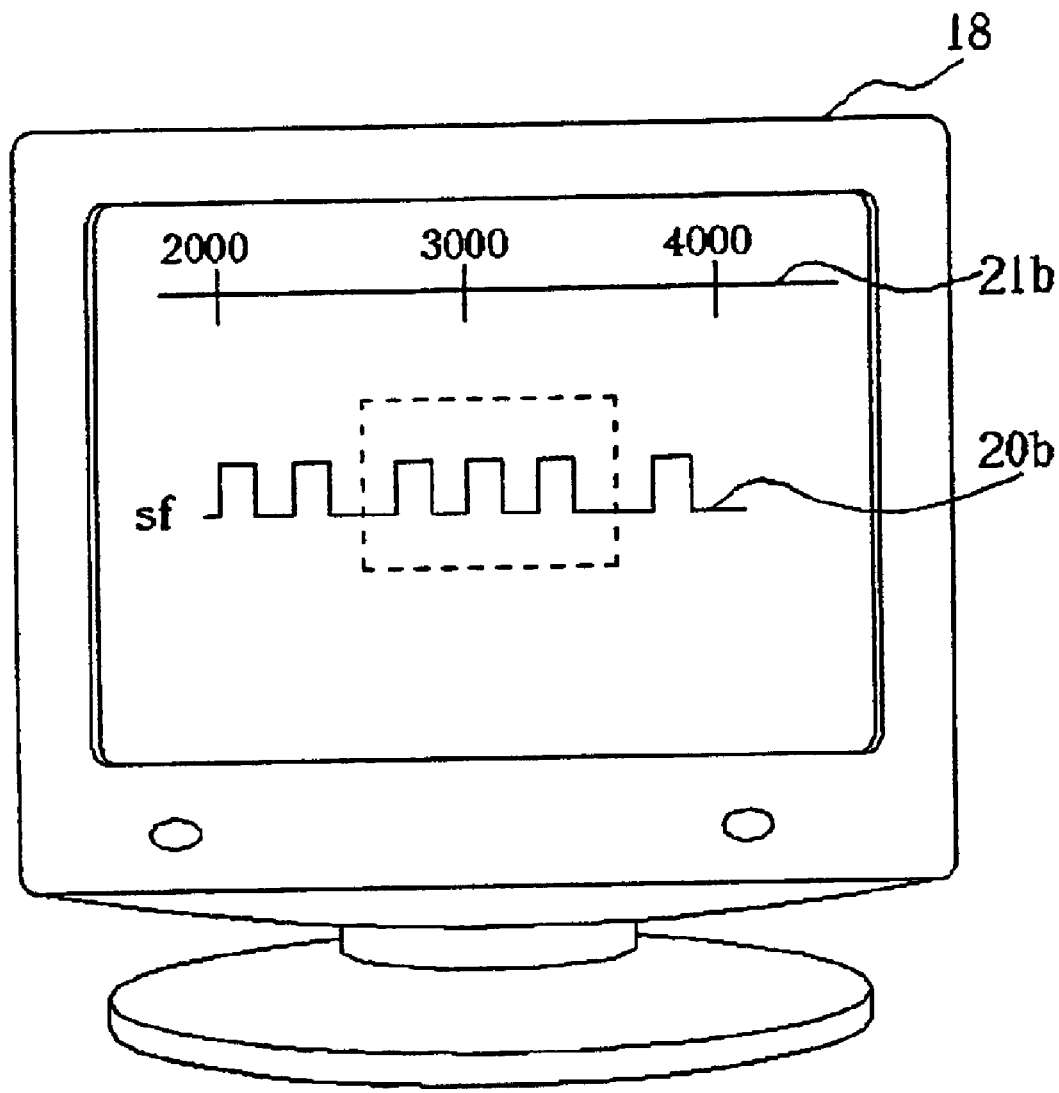
Figure 2C:
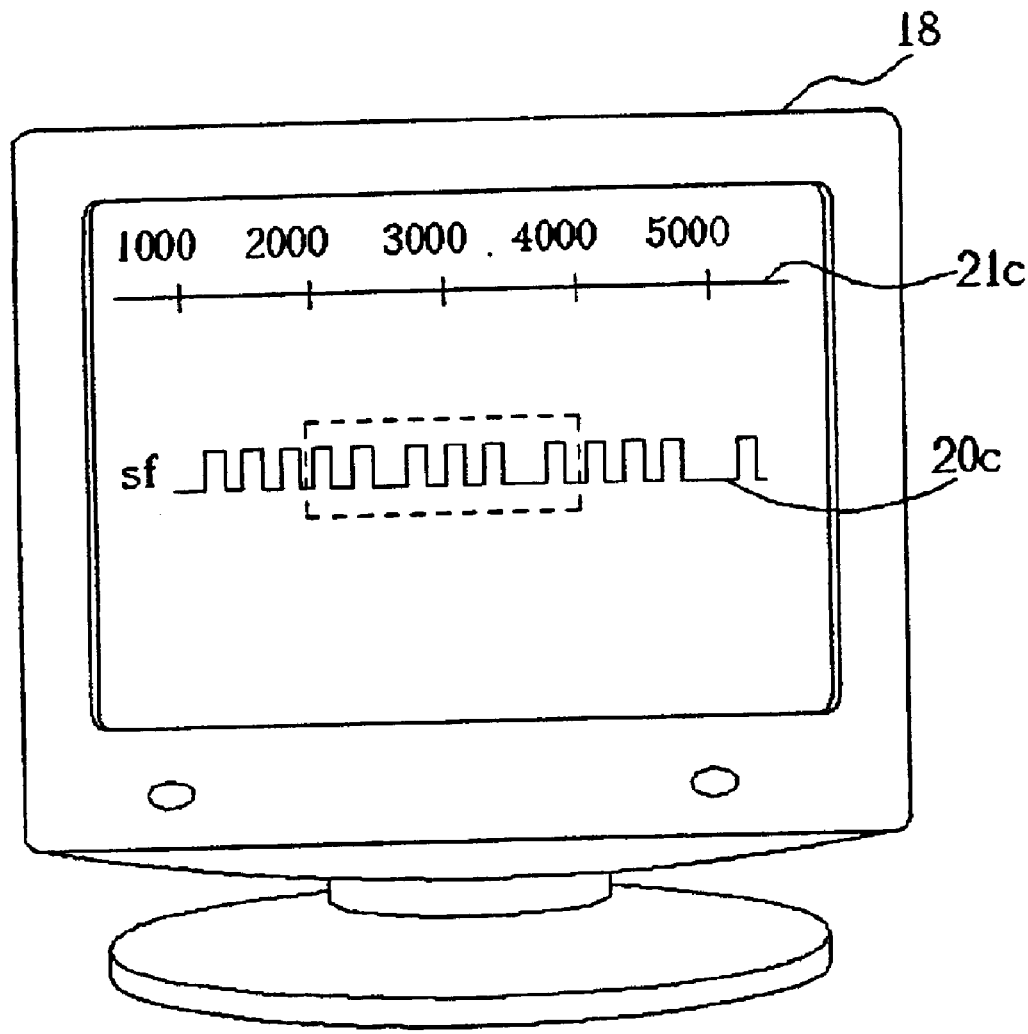
Figure 3:
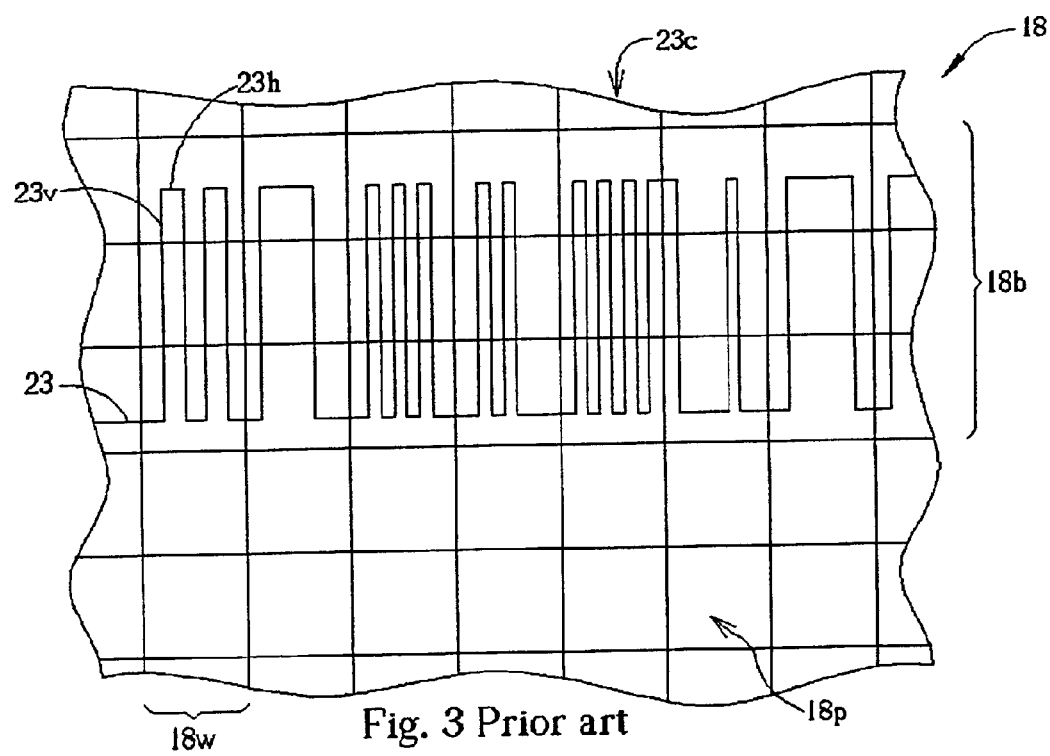
FIG. 3 is a detailed view of a display when attempting to display a highly time-compressed waveform according to the prior art.
Figure 4:
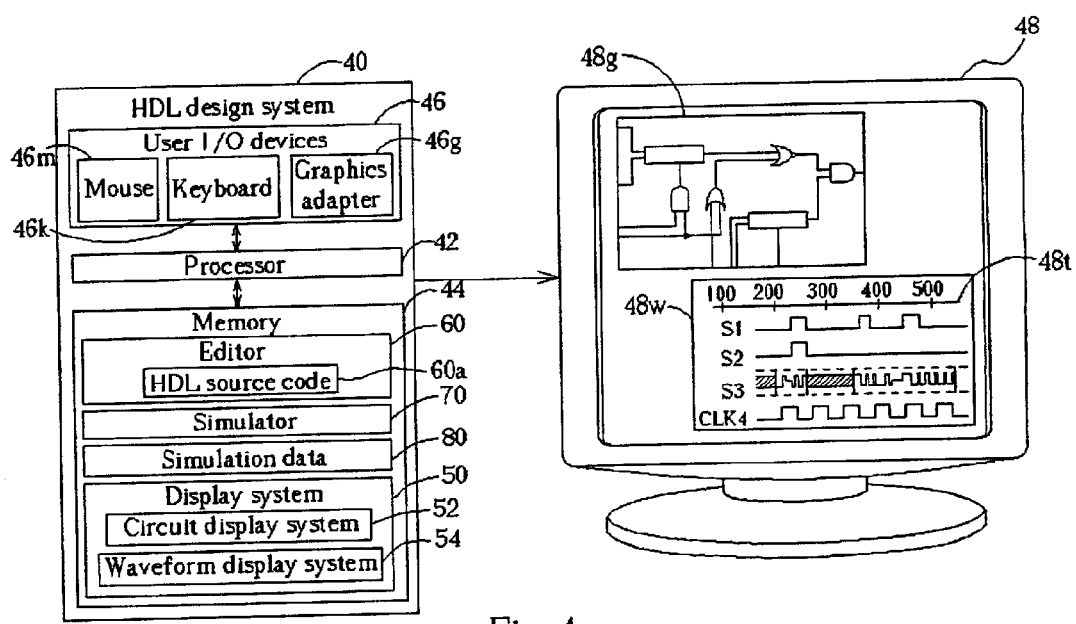
FIG. 4 is a block diagram of a computer system according to the present invention.

Please refer to FIG. 4. FIG. 4 is a block diagram of a computer system 40 according to the present invention for a hardware description language (HDL) development system. Many of the features of the computer system 40 are common to the prior art, and so do not need to be discussed in detail. The present invention, however, provides a specialized display system 50 that enables the fast displaying of waveform data onto a display device, such as a monitor 48, and the invention-related features of the display system 50 will be described in detail in the following.

The computer system 40 includes a processor 42 in communications with a memory 44 and user input/output (I/O) devices 46, and is connected to a monitor 48 to present graphical information to a user. The monitor 48 is typically a cathode ray tube (CRT), or a liquid crystal display (LCD), though other devices are certainly possible, such as a projection device or the like. The user I/O devices 46 will include hardware, a so-called graphics adapter 46g, for controlling the monitor 48. This graphics adapter 46g, in turn, can be controlled by software in the display system 50. Such graphics adapters 46g, and their varied and related capabilities, are well known in the art of computer display technologies.

The memory 44 will include both working memory for the processor 42, such as dynamic random access memory (DRAM) or the like, and non-volatile memory, such as a hard disk. Under most operating systems, virtual memory, as provided by the operating system, tends to blur distinctions between the two types of memory in most applications. The memory 44 holds software that is executed by the processor 42 to provide the functionality of the HDL development system 40. This software includes an editor 60 that permits a user to view and modify HDL source code 60a, a simulator 70 that uses the HDL source code 60a to generate simulation data 80, and the display system 50 for presenting information to the user by way of the monitor 48.

In the preferred embodiment, the display system 50 utilizes a windowing environment to present information to a user on the monitor 48, though this is not a requirement. The display system 50 includes a circuit display system 52 that presents, in a window 48g, a graphical illustration of the circuit defined by the HDL source code 60a, and a waveform display system 54 that presents, in a window 48w, the waveforms of signals in the simulation data 80. The waveforms are labeled according to the name of their associated signals, as obtained from the HDL source code 60a, and are presented against a timeline 48t that indicates the simulated execution time. In this manner, a user can quickly see the transition that a signal has made, and at what execution time this transition takes place. The user may select, by way of the user I/O devices 46, which signals in the simulation data 80 to display, and may further zoom out and zoom in to expand or contract the range of the timeline 48t, as well as pan left and right to see earlier or later simulated execution times.

Figure 5:
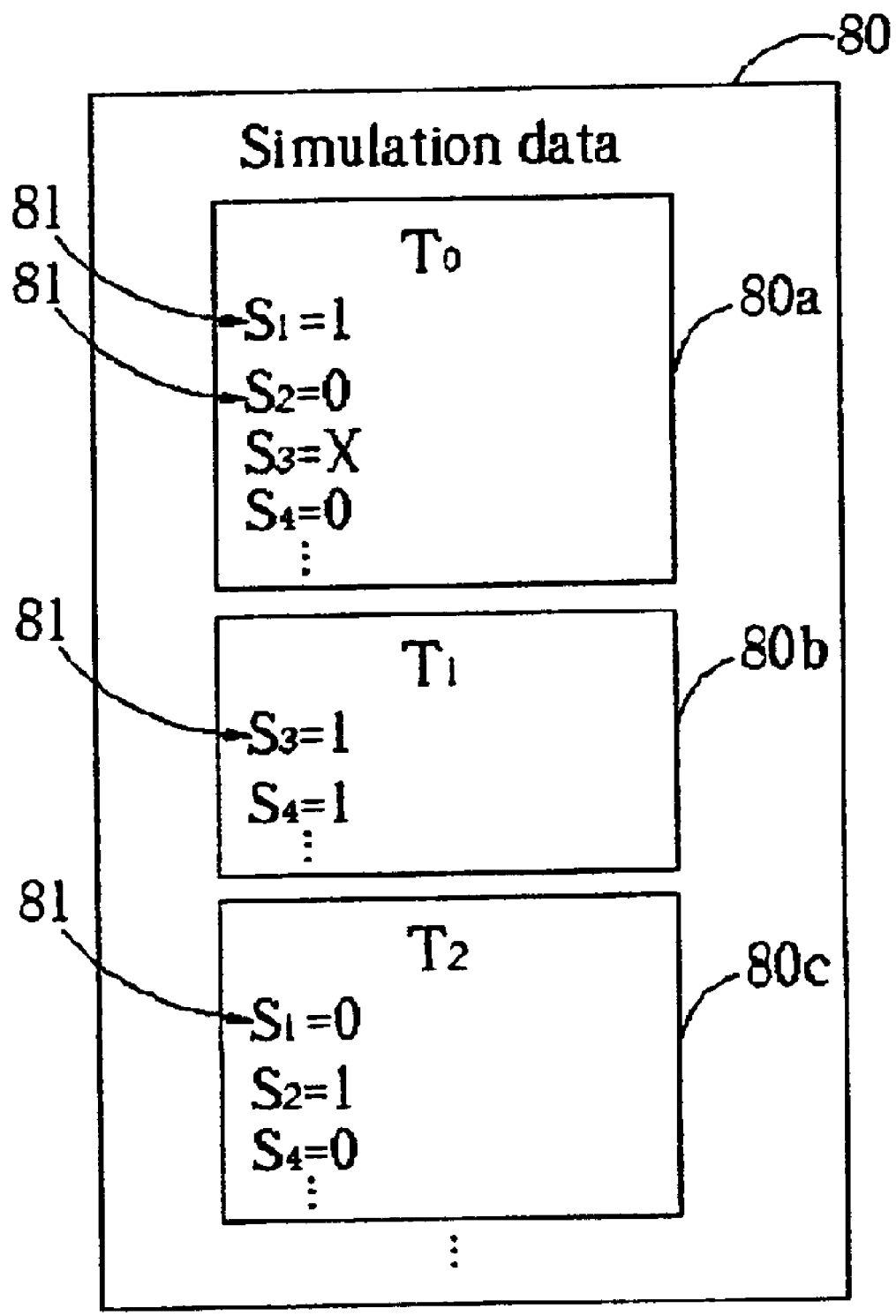
FIG. 5 is a sample diagram of simulation data.

The HDL source code 60a may contain the description for a circuit containing thousands of signals, and the simulator may "run" this circuit over a simulated time range that can span hours or even days. Hence, the simulation data 80 can be quite large, reaching hundreds of megabytes or more in size. To keep the size of the simulation data 80 to a minimum, only transition events of signals are recorded, rather than recording the state of every signal at every possible execution time. To better understand this, please refer to FIG. 5. FIG. 5 is a sample diagram of the simulation data 80. An initial entry 80a for a simulated time $T_0$, which is usually the first simulated execution time, holds entries that indicate the state of all signals 81 at the time $T_0$. A subsequent entry 80b for a simulated execution time $T_1$ holds the new state of all signals 81 that underwent a transition at time $T_1$. For example, at time $T_1$, signals $S_3$ and $S_4$ became a logical one. As there is no mention of signals $S_1$ or $S_2$ in entry 80b, it is assumed that the signals $S_1$ and $S_2$ at time $T_1$ remain one and zero, respectively, as from the previous entry 80a. A subsequent entry 80c for an execution time $T_2$ holds the new states of all signals 81 that undergo state transitions at time $T_2$, which includes signals $S_1$ and $S_2$. Hence, from time $T_0$ up to, but not including, time $T_2$, signals $S_1$ and $S_2$ had logical states of one and zero, respectively. However, at time $T_2$, signals $S_1$ and $S_2$ transitioned into logical states zero and one, respectively. Also, at time $T_2$, signal $S_4$ transitions back to a logical zero. It should be clear that by only recording signal state transitions in this manner, a significant savings in the file size of the simulation data 80 can be obtained.

Figure 6:
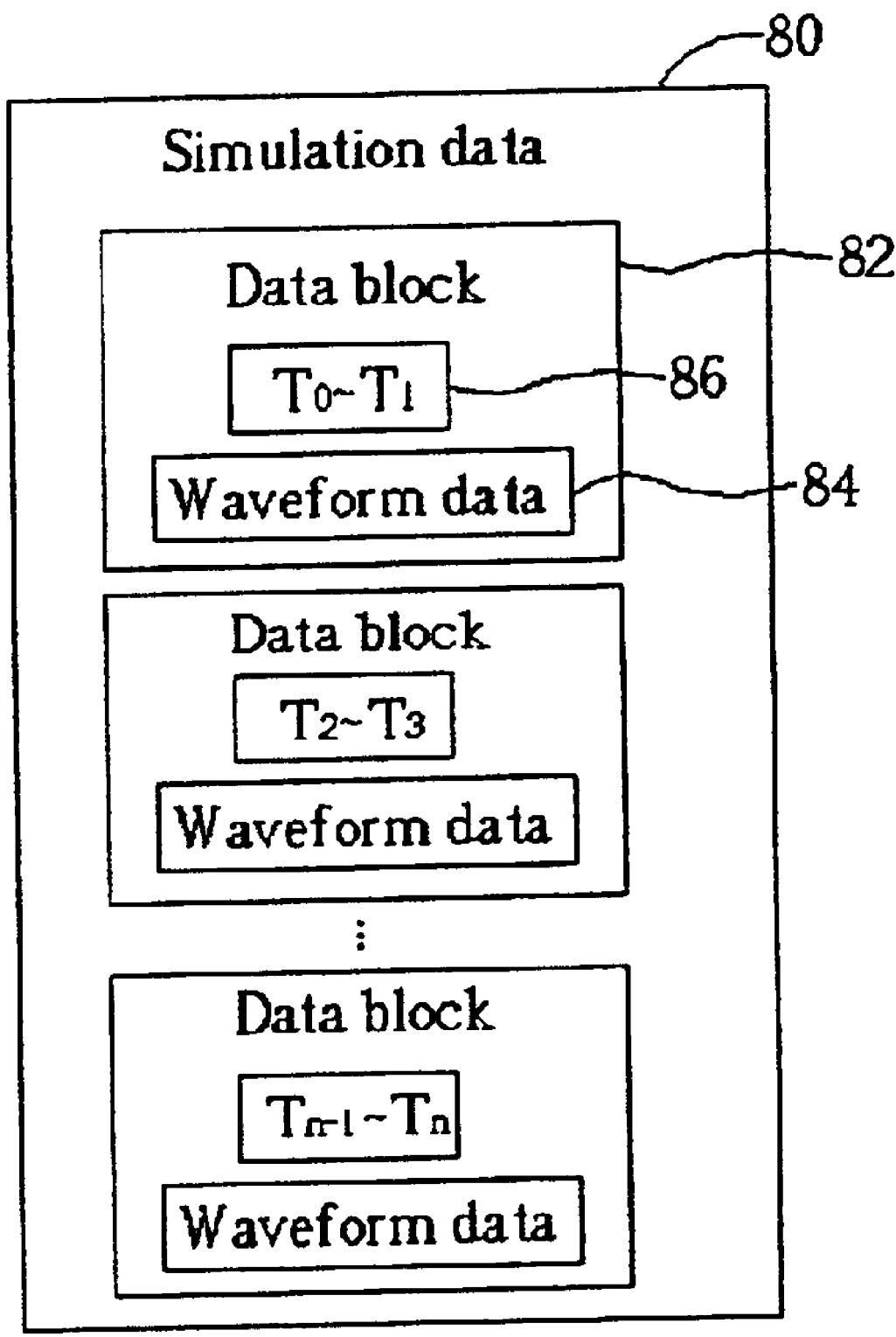
FIG. 6 is a block diagram of simulation data according to the present invention.

Please refer to FIG. 6. FIG. 6 is a block diagram of the simulation data 80. The simulation data 80 is broken into a plurality of data blocks 82. The purpose of the data blocks 82 is to provide more manageable subsets of the simulation data 80. The partitioning method employed to generate the data blocks 82 is a design choice, and will depend upon the response characteristics most desired of the waveform display system 54. For example, the data blocks 82 may be partitioned into sections that span approximately the same amount of simulated execution time. Or, the data blocks 82 may be partitioned into sections that store approximately the same amount of simulation data. Other methods may be employed that attempt to balance hard disk access and throughput considerations with typical user display request activities. It is further possible not to physically partition the simulation data 80 into several separate files, but rather to virtually partition the simulation data 80 by way of an index table in a manner familiar to those in the art of databases. Regardless of the partitioning method used, each data block 82 will hold waveform data 84 for a certain simulated execution time range 86. The waveform data 84 holds state transitions for all signals 81 in the execution time range 86, in the manner described for FIG. 5. Note that $T_0, T_1, \ldots, T_N$ in FIG. 5 and FIG. 6 do not necessarily indicate the same simulation times in their respective figures. That is, in FIG. 6, each data block 82 can certainly hold more than two simulated time transition event entries.

Figure 7:
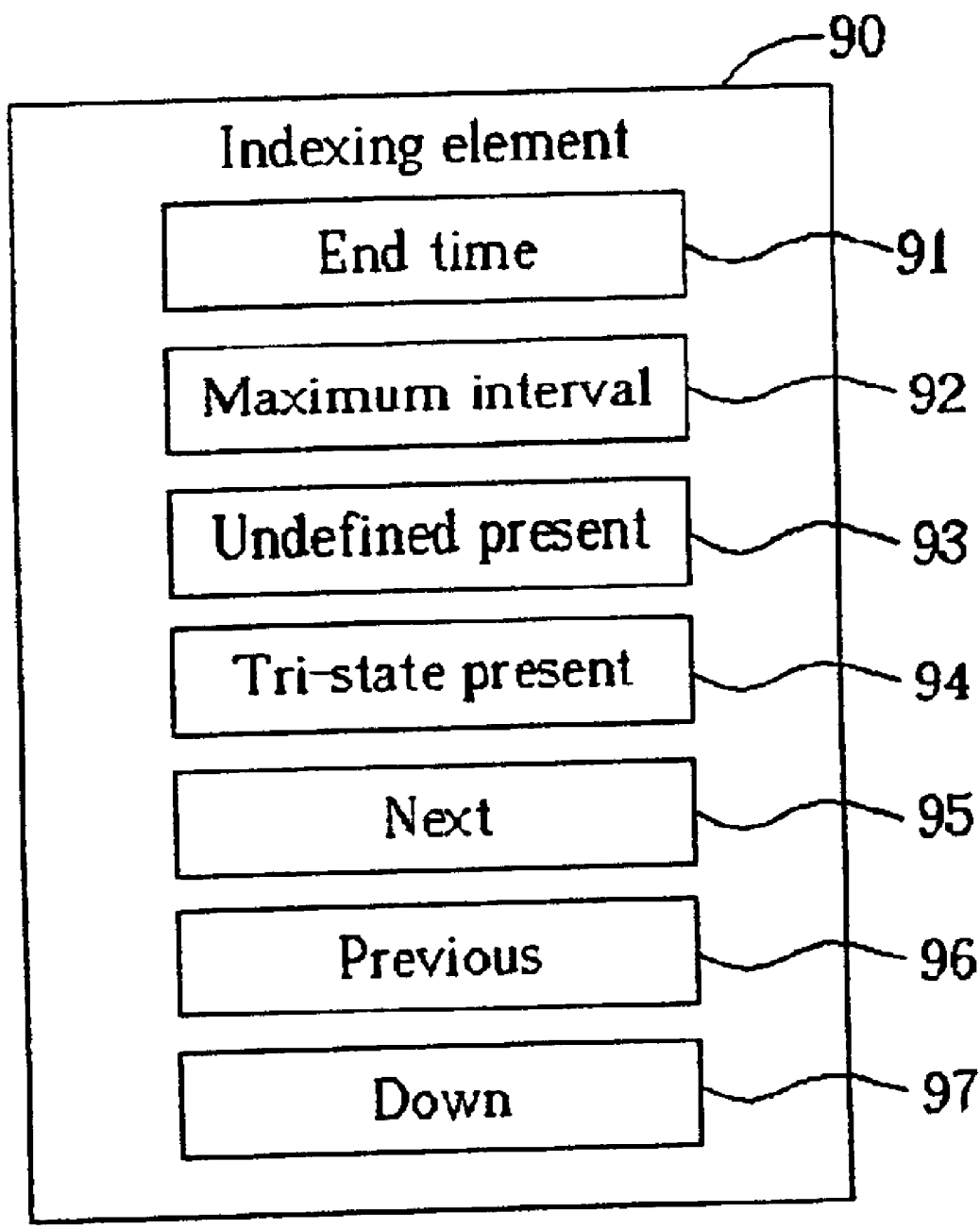
FIG. 7 is a block diagram of an indexing element according to the present invention.

Please refer to FIG. 7. FIG. 7 is a block diagram of an indexing element 90 according to the present invention. The indexing element 90 is used to build a tree structure for quickly accessing a signal 81 in the simulation data 80. Each signal 81 is provided its own tree structure of indexing elements 90. The tree structure is provided by a down pointer 97, which points to a lower level (i.e., "child") indexing element 90, or, at the lowest level, to a data block 82 in the simulation data 80. Indexing elements 90 at the same level in the tree structure (i.e., "siblings") are accessed through next 95 and previous 96 pointers. The next pointer 95 points to a sibling indexing element 90 that is later in simulated execution time. The previous pointer 96 points to an indexing element 90 that is earlier in simulated execution time. Each indexing element 90 covers a certain range of simulated execution times. Lower level indexing elements 90 cover smaller ranges, whereas upper level indexing elements 90 cover broader ranges. The ending execution time of this range is indicated by an end time entry 91, which may, for example, be a 32-bit value. The corresponding starting execution time can be obtained from the end time 91 of the previous sibling indexing element 90 by way of the previous pointer 96. If the previous pointer 96 is a nil pointer, then the corresponding starting execution time of the indexing element can be assumed to be the earliest simulated execution time. A maximum interval entry 92 holds the maximum length of simulated execution times between a state transition of the corresponding signal of the indexing element 90, and may be a 32-bit value. An undefined present entry 93, which may be a single bit, indicates whether the signal is in an undefined state at any time within the simulated execution time range of the indexing element 90. Similarly, a tri-state present bit 94 indicates if the corresponding signal goes into a tri-state condition within the simulated execution time range of the indexing element 90.

Figure 8A:
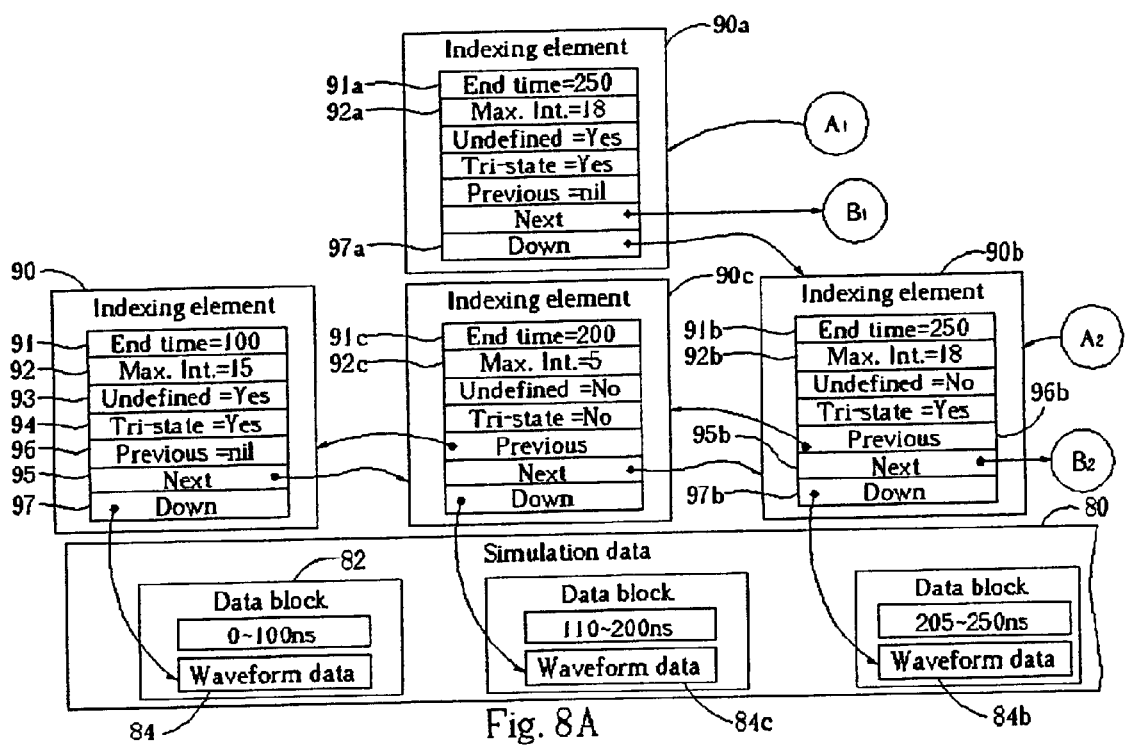
FIGS. 8A and 8B are partial detailed example data structure diagrams utilizing the indexing elements of FIG. 7 to quickly access the simulation data of FIG. 6.
Figure 8B:
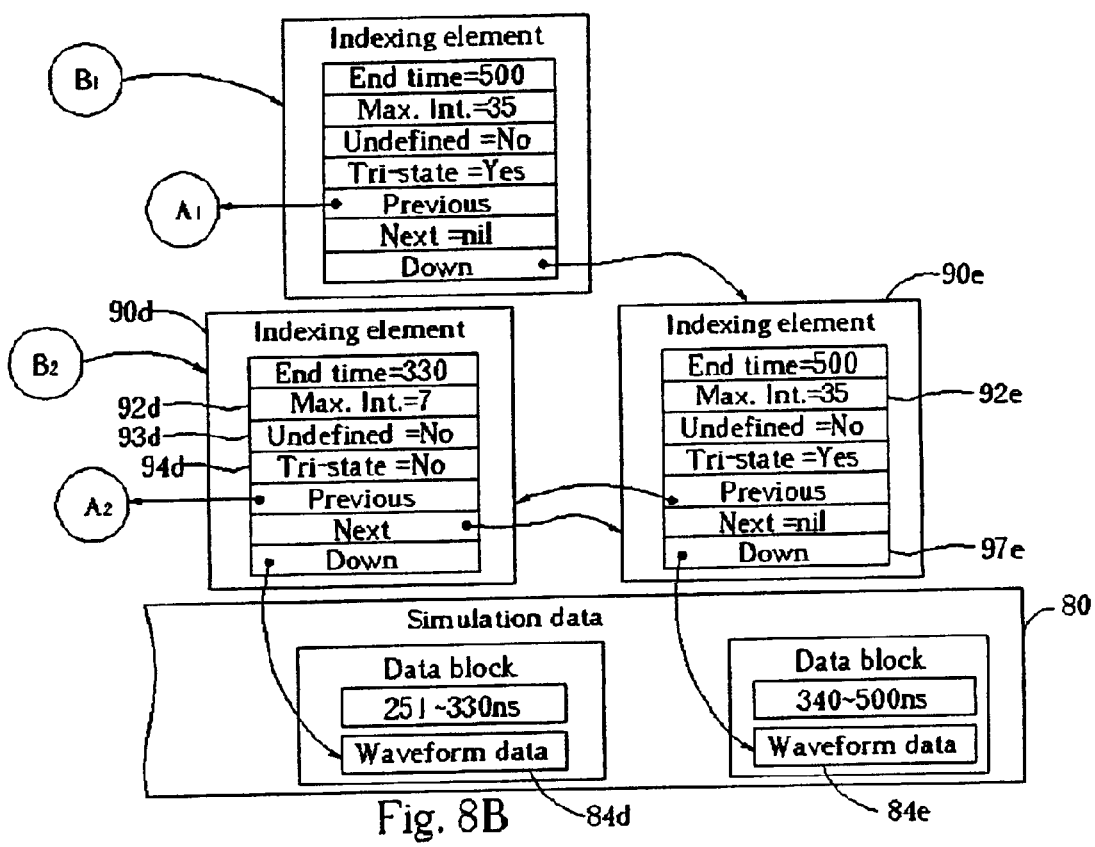

As a functional example of the indexing elements 90, please refer to FIG. 8. FIG. 8 is a partial detailed example data structure diagram utilizing the indexing elements 90 to quickly access the simulation data 80. FIG. 8 illustrates the lower levels of the tree structure formed by indexing elements 90. Within FIGS. 8A and 8B, encircled As and Bs indicate links to and from indexing elements 90 on another page. Although the waveform data 84 holds transition information for a plurality of signals 81, the tree structure formed by the indexing elements is dedicated to a single signal 81 within the simulation data 80. Each signal 81 for which a waveform is to be drawn is provided its own corresponding tree structure of indexing elements 90.

At the lowest level, an indexing element 90 is provided for each data block 82 of the simulation data 80. The down pointer 97 points to the waveform data 84 of the corresponding data block 82. The end time 91 thus indicates the last transition time within the waveform data 84. Alternatively, the end time 91 may indicate the last transition time of the signal 81 in the waveform data 84. The two simulated execution times need not be the same, and it is a design choice as to which should be used. The maximum interval 92 holds the maximum length of simulated execution time for which the signal 81 underwent no transitions. Hence, within the waveform data 84, the signal 81 is guaranteed to undergo a state transition at least once for every period indicated by the maximum interval 92. The maximum interval value 92 should be explicitly computed from the waveform data 84, and not arbitrarily set, so as to ensure a value that is a low as possible, while still being true. The undefined 93 and tri-state 94 Booleans indicate whether the waveform data 84 holds any undefined or tri-state values, respectively, for the signal 81. The previous pointer 96 points to an indexing element 90 that corresponds to an immediately prior data block 82, or nil if no such is present. Similarly, the next pointer 95 points to an indexing element 90 that corresponds to an immediately subsequent data block 82, or nil if no such is present.

At an upper level in the tree structure, a parent indexing element 90 covers a simulated execution time range that spans several lower level children indexing elements 90.

That is, the "children" 90 of a parent indexing element 90 are all those lower level indexing elements 90 that have simulated execution time ranges that are within the range of the parent 90. The down pointer 97 of a parent indexing element 90 points to a child indexing element 90 having an end time 91 that covers the end time 91 of the parent 90. Note that the maximum interval value 92 of a parent indexing element 90 should contain a value that is the greatest of all its corresponding children 90. In effect, a parent indexing element 90 offers summary information of its children 90. Thus, if any of the children 90 have a tri-state bit 94 set to indicate that tri-state values of the signal 81 are present, then the parent 90 should also have its tri-state bit 94 set. The same holds true for the undefined bit 93. The indexing elements 90 are held within the memory 44 of the computer system 40, and are generally constructed when the simulation data 80 is partitioned into its constituent data blocks 82. The method of generating the trees of indexing elements 90, one for each signal 81 to be displayed, should be clear to one skilled in the art from the foregoing description. It should be noted that although it is possible to generate an indexing element tree for every signal 81 in the simulation data 80 at the time of loading and partitioning the simulation data 80, it is also possible to selectively generate indexing element trees for only those signals 81 that the user has decided to view. When a user decides to view a new signal 81, a corresponding indexing element tree for this new signal 81 may be generated on the fly. This may help to conserve space in the memory 44.

Figure 9:
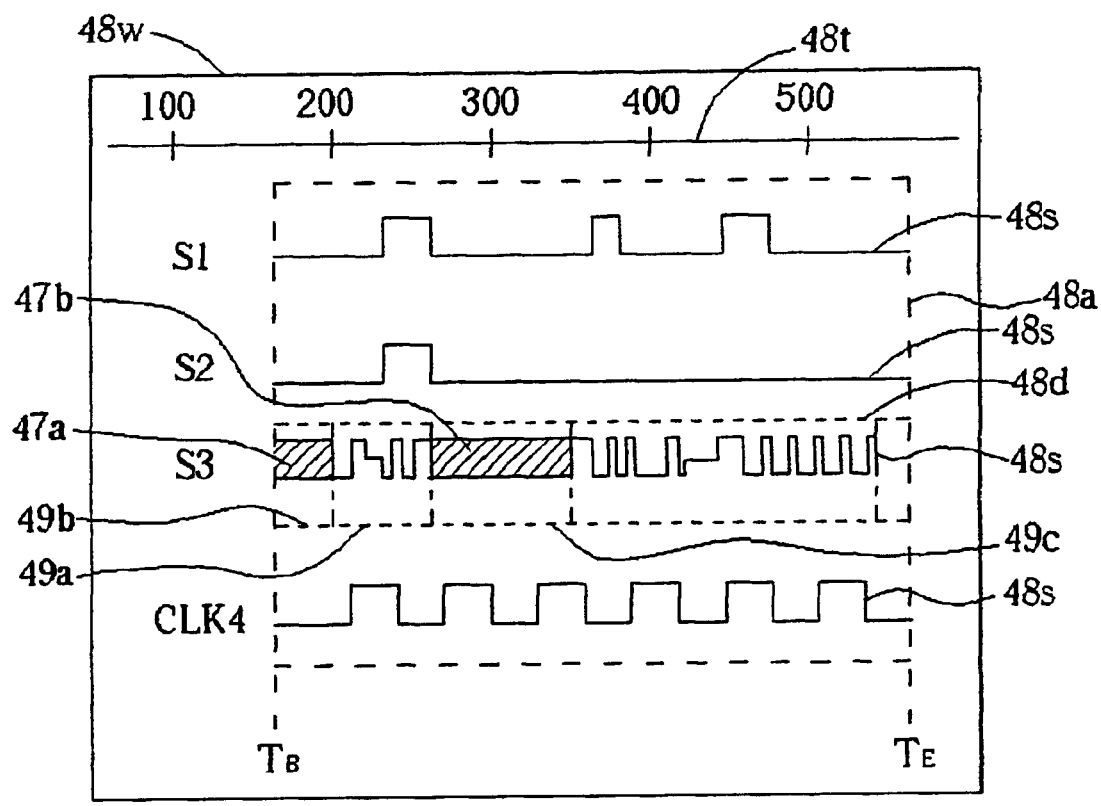
FIG. 9 is a detailed view of a waveform displaying window shown in FIG. 4.

Please refer to FIG. 9. FIG. 9 is a detailed view of the waveform displaying window 48w of FIG. 4. In general, signal waveforms 48s will not span the entire width of the window 48w. Instead, a region 48r is allocated in a margin of the window 48w to provide the associated names of the signal waveforms 48s. Consequently, the waveforms 48s are drawn within a target area 48a of the window 48w. This target area 48a will have a physical width 48x, in terms of pixels, along the horizontal of the display device 48. As the horizontal axis is used to represent simulated execution time, as indicated by the timeline 48t, the horizontal axis will also have a logical width in terms of simulated execution time, with a beginning time given by $T_B$ and an ending time given by $T_E$. With simulated execution times increasing from left to right, $T_B$ marks the leftmost edge of the target area 48a, while $T_E$ marks the rightmost edge of the target area 48a. Each pixel (not shown) in the target area 48a thus spans a logical width, or range, of simulated execution time, which is given by:

$$T_P = (T_E - T_B)/n \qquad \text{Eqn.1}$$

Where "n" is the number of pixels that physically span the width 48x, and is necessarily greater than one to enable the presentation of any waveform information at all.

One skilled in the art will appreciate that for a simulated execution time range of signal waveform data 84 indicated by an indexing element 90, if the corresponding maximum interval 92 is less than $T_P$ it will be impossible to resolve the corresponding waveform for the signal 81. This is simply because even the maximum logical distance (in time, as given by the maximum interval 92) of the transitions is less than the physical width of a pixel. $T_P$ thus marks the absolute minimum logical transition width that may be resolved by the display device 48. $T_P$ may be termed the minimum time resolution of the display device 48, and must be recalculated every time the user zooms in or zooms out the signal waveforms 48s. As a practical matter, even waveforms 48s that transition at every $T_P$ interval, as provided by Eqn.1 above, will appear as a block of solid color, and hence not be resolvable. Generally, to clearly resolve a signal waveform 48s, at least one pixel should lie between transitions of the waveform 48s. Hence, the most general equation for the minimum time resolution is:

$$T_P = Q*(T_E - T_P)/n \qquad \text{Eqn.2}$$

Where Q is a value that is preferably greater than or equal to two. The exact value of Q, however, is a design choice.

To present a signal waveform 48s on the display 48, the topmost parent indexing element 90 of the signal 81 is found. $T_B$ and $T_E$ should already be known from previous zooming and panning operations of the user, and are used to find appropriate indexing elements 90. As each indexing element 90 spans a region of simulated execution time, certain indexing elements will necessarily land at least partially within the logical boundary defined by $T_B$ and $T_E$. If the maximum interval 92 of such an indexing element 90 is less than $T_P$, then a predetermined image, such as a filled box, can be drawn instead of an actual waveform, within the logical region in the target area 48a that corresponds to the indexing element 90.

To illustrate by way of example, consider drawing signal waveform S3 of FIG. 9, and further assume that FIG. 8 is the corresponding indexing element tree for the signal S3, that $T_B$ is 150 ns, that $T_E$ is 520 ns, and that $T_P$ is 13 ns. Initially, indexing element 90a is accessed, having an end time 91a of 250 ns and a maximum interval value 92a of 18. Since the maximum interval value 92a exceeds $T_P$, which has a value of 13 ns, it is assumed that actual drawing of the waveform 48s will have to be done, and down pointer 97a is used to access child indexing element 90b in the next lower level of the indexing element tree. Indexing element 90b spans a simulated execution time from about 200 ns, obtained from indexing element 90c via previous pointer 96b, to 250 ns, obtained from end time 91b, and thus lies fully within a first region 49a of the target display area 48a. As the maximum interval value 92b of 18 exceeds $T_P$, it is assumed the waveform data 84b for signal S3 is at least partially resolvable. Down pointer 97b is thus used to access the waveform data 84b, and so explicitly draw all transitions of the waveform for signal S3 within the first region 49a. Previous pointer 96b is then used to access indexing element 90c so as to enable drawing of the waveform in a second region 49b in the target area 48a that is earlier than the first region 49a. Indexing element 90c spans a simulated execution time from about 100 ns to 200 ns, and has a maximum interval value 92c of five. Indexing element 90c thus corresponds to waveform data 84c that spans the second region 49b. However, since the maximum interval 92c is less than $T_P$, it is assumed that the waveform data is not resolvable on the display 48, as signal S3 within the second region 49b will transition too frequently along the horizontal axis. Instead, a solidly filled box 47a is used to represent the waveform 48s for signal S3 in the second region 49b. This is a significantly faster drawing operation as it requires no actual accessing of the waveform data 84c, and eliminates uselessly repetitive line drawing operations. Note that appropriate clipping to the target area 48a must be performed. Indexing element 90c has a start time of about 100 ns, which is before $T_B$. The box 47a is thus drawn from a logical time of $T_B$, at 150 ns, to the end time 92c of 200 ns. The start time of the box is thus the greater of $T_B$ and the start time of indexing element 90c. Similarly, clipping must be performed at $T_E$, so that the end time of the box 47a will be the lesser of the end time 91c and $T_E$. At this point, the waveform 48s for signal S3 has been drawn, in logical coordinates, from time $T_B$ to the end time 91b of 250 ns. It is therefore necessary to draw the waveform 48s for signal S3 from a time of 250 ns to $T_E$ at 520 ns. Working through the indexing element tree in either a vertical or a horizontal manner (though horizontal is preferred in this case as the indexing elements 90 are sorted by simulated time), the waveform display system 54 finds indexing element 90d, which spans a time range from about 250 ns to 330 ns, indicated by a third region 49c. The maximum interval value 92d for indexing element 90d is seven, which is less than $T_P$ at 13 ns. The waveform display system 54 thus draws a box 47b that spans the third region 49c, and no accessing of waveform data 84d is required. Finally, indexing element 90e is used to draw the remainder of the waveform 48s for signal S3, from a time of 330 ns to 500 ns, corresponding to a fourth region 49d. As the maximum interval 92e exceeds $T_P$, it is assumed that at least some of the waveform data is resolvable. Down pointer 97e is thus used to access the waveform data 84e, and so to draw the waveform 48s within the fourth region 49d.

Note that by using parent indexing elements 90, even larger swaths of simulation data 80 can potentially be ignored in favor of drawing a predetermined image. For example, if $T_P$ were 20 ns rather than 13 ns, when drawing the waveform 48s for signal S3, parent indexing element 90a would indicate that a box could be drawn from $T_B$ to the end time 91a of 250 ns (as the maximum interval 92a is less then $T_P$). There would thus be no reason to access child indexing elements 90b and 90c, nor their related waveform data 84b and 84c. This leads to a significant improvement in the drawing speed of the waveforms 48s.

Two signal conditions are of particular interest to designers: when a signal is in an indeterminate state, and when a signal is in a tri-state state. Indeterminate signal conditions are of particular concern as they tend to propagate through a circuit, leading to unpredictable circuit behavior. As previously indicated, the undefined 93 and tri-state 94 entries in an indexing element 90 respectively indicate if, within the time span of the indexing element 90, the signal enters an indeterminate or tri-state condition. In the event that one of the entries 93 or 94 is true and a predetermined image is being drawn instead of an actual waveform, it is advisable to draw the predetermined image in a manner that will alert the user that a tri-state or indeterminate state is present within the region spanned by the predetermined image. For example, if indexing element 90d had an undefined present entry 93d that was "Yes" (i.e., true) rather "No" (i.e., false), then box 47b could be drawn filled with a special color, such as in red. If the tri-state present entry 94d were "Yes", then the 47b could be drawn in green. If both tri-state present 94d and undefined present 93d entries are "Yes", then the box 47b could be drawn in yellow. In this manner the user is visually alerted of signal state conditions that may be of relative importance. Alternatively, if either of the tri-state present 94 or undefined present 93 entries are "Yes", then the waveform display system 54 may choose to access the simulation data 80 to explicitly draw the waveform 48s in the region corresponding to the indexing element 90, regardless of the maximum interval value 92, and draw the tri-state or indeterminate transition in an indicative color.

In contrast to the prior art, the present invention provides a maximum interval value that is used to determine if a region of waveform data is resolvable on a display. The maximum interval value indicates the maximum amount of time between transitions of a signal. If this value is less than a resolvable value for the display, then a predetermined image is drawn in place of the actual waveform, thereby saving time by eliminating data fetching from the simulation data, and eliminating redundant line drawing operations. To further improve waveform drawing speeds, indexing elements are provided to generate an indexing element tree for each signal to be displayed. Successive layers of detail provided by the tree structure permit large blocks of simulation data to be immediately ignored at higher layers, and considered in smaller ranges (and hence data sizes) at lower layers.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for displaying waveform data on a display of a computer system, the waveform data comprising a plurality of waveform signals, each waveform signal having at least one transition event, the method comprising:

for a waveform signal, providing at least one indexing element, each indexing element corresponding to a time range of the waveform data;

for each indexing element, providing a pointer into the waveform data;

for each indexing element, further providing a maximum interval value, wherein the maximum interval value indicates the maximum amount of time spanned between transition events of the waveform signal within the time range corresponding to the indexing element;

determining a minimum time resolution within which transition events of the waveform signal may be adequately resolved on the display;

within a first display region corresponding to a first indexing element having a maximum interval value that exceeds the minimum time resolution, using the pointer of the first indexing element to access and draw transition events for the waveform signal that are within the time range of the first indexing element to present a waveform for the waveform signal; and within a second display region corresponding to a second indexing element having a maximum interval value that is less than the minimum time resolution, drawing a predetermined image in place of transition events for the waveform signal.

2. The method of claim 1 further comprising:

obtaining a first endpoint time that is the lesser of a first time-endpoint of the first display region, and a first time-endpoint of the first indexing element;

obtaining a first startpoint time that is the greater of a first time-startpoint of the first display region, and a first time-startpoint of the first indexing element; and using the pointer of the first indexing element to access and draw all transition events of the waveform signal that are between the first startpoint time and the first endpoint time.

3. The method of claim 1 further comprising:

obtaining a second endpoint time that is the lesser of a second time-endpoint of the second display region, and a second time-endpoint of the second indexing element;

obtaining a second startpoint time that is the greater of a second time-startpoint of the second display region, and a second time-startpoint of the second indexing element; and drawing the predetermined image to span from the second startpoint time to the second endpoint time.

4. The method of claim 1 further comprising:

for each indexing element, providing a special-state flag that indicates the presence of a special state of the waveform signal within the time range corresponding to the indexing element; and within a third display region corresponding to a third indexing element having a special-state flag set to indicate the presence of a special state of the waveform signal, drawing a special image in the third display region.

5. The method of claim 4 wherein the special state of the waveform signal includes an indeterminate value state of the waveform signal, or a tri-state value of the waveform signal.

6. The method of claim 4 wherein transition events for the waveform signal are drawn in the third display region regardless of the maximum interval value of the third indexing element.

7. A computer system comprising:

a memory for holding waveform data comprising a plurality of waveform signals, each waveform signal having at least one transition event;

a processor; and program code stored in the memory and executable by the processor to perform the following:

for a waveform signal, providing at least one indexing element, each indexing element corresponding to a time range of the waveform data;

for each indexing element, providing a pointer into the waveform data;

for each indexing element, providing a maximum interval value, wherein the maximum interval value indicates the maximum amount of time spanned between transition events of the waveform signal within the time range corresponding to the indexing element;

determining a minimum time resolution within which transition events of the waveform signal may be adequately resolved on a display;

within a first display region corresponding to a first indexing element having a maximum interval value that exceeds the minimum time resolution, using the pointer of the first indexing element to access and draw transition events for the waveform signal that are within the time range of the first indexing element to present a waveform for the waveform signal on the display; and within a second display region corresponding to a second indexing element having a maximum interval value that is less than the minimum time resolution, drawing a predetermined image on the display in place of transition events for the waveform signal.

8. The computer system of claim 7 wherein the program code further contains instructions for:

obtaining a first endpoint time that is the lesser of a first time-endpoint of the first display region, and a first time-endpoint of the first indexing element;

obtaining a first startpoint time that is the greater of a first time-startpoint of the first display region, and a first time-startpoint of the first indexing element; and using the pointer of the first indexing element to access and draw on the display all transition events of the waveform signal that are between the first startpoint time and the first endpoint time.

9. The computer system of claim 7 wherein the program code further contains instructions for:

obtaining a second endpoint time that is the lesser of a second time-endpoint of the second display region, and a second time-endpoint of the second indexing element;

obtaining a second startpoint time that is the greater of a second time-startpoint of the second display region, and a second time-startpoint of the second indexing element; and drawing the predetermined image to span in the display from the second startpoint time to the second endpoint time.

10. The computer system of claim 7 wherein the program code further contains instructions for:

for each indexing element, providing a special-state flag that indicates the presence of a special state of the waveform signal within the time range corresponding to the indexing element; and within a third display region corresponding to a third indexing element having a special-state flag set to indicate the presence of a special state of the waveform signal, drawing a special image on the display in the third display region.

11. The computer system of claim 10 wherein the special state of the waveform signal includes an indeterminate value state of the waveform signal, or a tri-state value of the waveform signal.

12. The computer system of claim 10 wherein transition events for the waveform signal are drawn on the display in the third display region regardless of the maximum interval value of the third indexing element.

* * * * *